(12) United States Patent
Gu

(10) Patent No.: US 8,853,522 B1
(45) Date of Patent: Oct. 7, 2014

(54) CONCENTRATED PHOTOVOLTAIC AND SOLAR HEATING SYSTEM

(71) Applicant: Bingwu Gu, Elk Grove, CA (US)

(72) Inventor: Bingwu Gu, Elk Grove, CA (US)

( * ) Notice: Subject to any disclaimer, the term of this patent is extended or adjusted under 35 U.S.C. 154(b) by 88 days.

(21) Appl. No.: 13/840,575

(22) Filed: Mar. 15, 2013

(51) Int. Cl.
  *H01L 31/0232* (2014.01)
  *H01L 31/0525* (2014.01)
(52) U.S. Cl.
  CPC ............................... *H01L 31/058* (2013.01)
  USPC .......................................... 136/246; 136/259
(58) Field of Classification Search
  USPC ................................................ 136/246, 259
  See application file for complete search history.

(56) References Cited

U.S. PATENT DOCUMENTS

| | | | | |
|---|---|---|---|---|
| 4,131,485 | A * | 12/1978 | Meinel et al. | 136/259 |
| 4,210,463 | A * | 7/1980 | Escher | 136/246 |
| RE30,584 | E * | 4/1981 | Russell | 136/246 |
| 5,385,615 | A * | 1/1995 | Horne | 136/246 |
| 6,818,818 | B2 * | 11/2004 | Bareis | 136/246 |
| 2004/0140000 | A1 * | 7/2004 | Cohen et al. | 136/246 |
| 2006/0185713 | A1 * | 8/2006 | Mook, Jr. | 136/244 |
| 2006/0272698 | A1 * | 12/2006 | Durvasula | 136/246 |
| 2008/0245401 | A1 * | 10/2008 | Winston et al. | 136/246 |
| 2009/0145474 | A1 * | 6/2009 | Pang | 136/248 |
| 2009/0199892 | A1 * | 8/2009 | Farquhar | 136/248 |
| 2009/0308377 | A1 * | 12/2009 | Kleinwaechter | 126/605 |
| 2011/0226308 | A1 * | 9/2011 | Pang | 136/246 |

OTHER PUBLICATIONS

Rabl, Comparison of Solar Concentrators, Solar Energy, vol. 18, pp. 93-111, 1976.*

* cited by examiner

*Primary Examiner* — Jayne Mershon
(74) *Attorney, Agent, or Firm* — Gerald R. Prettyman

(57) ABSTRACT

A solar power system concurrently generates electricity and a heated transparent fluid while maintaining the solar cells at an optimum temperature and optimizing the heat transfer by matching the refractive index of the secondary sunlight concentrator to the transparent fluid. A solar tracker aligns a primary sunlight concentrator to collect sunlight and directs the sunlight and a system for transferring solar heat to a transparent fluid and into a solar power electrical generating system. The concentrated sunlight transfers solar heat to a transparent fluid via first pass through the transparent fluid. The concentrated sunlight is further concentrated to raise its temperature by passing the concentrated sunlight through a secondary sunlight concentrator, and then passed again through the transparent fluid to transfer heat. The solar energy diminished concentrated sunlight strikes a solar cell array to generate electricity.

11 Claims, 6 Drawing Sheets

CONCENTRATED PHOTOVOLTAIC AND SOLAR HEATING SYSTEM

CROSS-REFERENCE TO RELATED APPLICATIONS

This application is a Continuation of U.S. patent application Ser. No. 12/584,050 filed Aug. 27, 2009 titled CONCENTRATED PHOTOVOLTAIC AND SOLAR HEATING SYSTEM, and is related to U.S. patent application Ser. No. 12/584,052 titled "LOW NUMERICAL APERTURE (LOW-NA) SOLAR LIGHTING SYSTEM," filed Aug. 27, 2009 and is related to U.S. patent application Ser. No. 12/584,051 titled "GENERATING ALTERNATING CURRENT FROM CONCENTRATED SUNLIGHT" filed Aug. 27, 2009 all of which are incorporated by reference. These patent applications claim the benefit of priority of U.S. Provisional Application No. 61/094,113 titled "One-axis tracking concentrating photovoltaic and solar hot water hybrid system", U.S. Provisional Application No. 61/094,115 titled "Alternating current electricity generation from concentrated sunlight", U.S. Provisional Application No. 61/094,120 titled "Solar lighting system with one-axis tracking", and U.S. Provisional Application No. 61/094,117 titled "Low Numerical Aperture (Low-NA) Solar Lighting System", all filed Sep. 4, 2008 and all of which are incorporated by reference.

BACKGROUND

1. Field of Invention

This invention relates to the field of solar energy and specifically for using concentrated sunlight for the concurrent generation of electricity within the same system as heating of a fluid for heating applications.

2. Related Art

Typical solar energy systems generate electrical power by either the direct conversion of concentrated or unconcentrated sunlight using solar cells (concentrated photovoltaic, CPV), or by using concentrated solar thermal (CST) energy to generate a pressurized vapor for turning a turbine-generator.

Concentrated photovoltaic (CPV) systems have a moderate efficiency of about 40% under a concentration of 500 suns and at an ambient temperature of 25 degrees C. The solar cells are sensitive to temperature, however, so that the efficiency drops to about 35% at about 100 degrees C., which highly concentrated sunlight is capable of achieving as shown in the use of concentrated sunlight to boil water for evaporation systems. In addition, concentrated photovoltaic (CPV) systems need a two-axis solar tracking and are expensive. As such, the return of investment period for localized installations is many years.

Concentrated solar thermal (CST) energy systems, on the other hand, can and must operate at a high temperature, and may reach a thermal efficiency of 60-80%. Collector to grid energy conversion losses, however, lowers the overall efficiency to about 15%. In addition, turbine-generator systems have inherent safety issues and are high maintenance, which raises the cost of the delivered power. As such, concentrated solar thermal (CST) energy systems are not suitable for localized installations.

SUMMARY OF THE INVENTION

Systems and methods provide for the solar generation of electricity and transferring solar heat to a transparent fluid with a solar power generation system having a primary sunlight concentrator and a secondary sunlight concentrator with a refractive index matched to the refractive index of the transparent fluid and using the transparent fluid to maintain the solar cell array at an optimum temperature.

A solar tracking system aligns the primary sunlight concentrator towards the sun for concentrating sunlight and directs the concentrated sunlight into a solar power generating unit. The solar tracking system may be a one-axis azimuth tracking system or a two-axis system.

A transparent fluid is heated by passing concentrated sunlight through the transparent fluid, then further concentrating the sunlight and passing the further concentrated sunlight through the transparent fluid a second time. The transparent fluid also absorbs some the ultraviolet light that is harmful to some solar cells. The concentrated sunlight then strikes a solar cell array to generate electricity, which generates more heat. The heat is removed from the solar cell by the transparent fluid. In some embodiments the transparent fluid may be pumped through the solar power generating unit. In some embodiments the transparent fluid may be in convection motion through the solar power generating unit.

Different embodiments provide for using different concentrator systems. A concentrator system may have a parabolic trough primary concentrator with a compound parabolic secondary sunlight concentrator. A concentrator system may have a Fresnel lens primary concentrator with a compound parabolic secondary sunlight concentrator.

The solar power generation unit may be within a single transparent containment system suspended above a second solar cell array for capturing sunlight that misses the solar power generation unit.

BRIEF DESCRIPTION OF THE DRAWINGS

Elements in the figures are illustrated for simplicity and clarity and are not drawn to scale. The dimensions of some of the elements may be exaggerated relative to other elements to help improve the understanding of various embodiments of the invention.

DETAILED DESCRIPTION OF THE INVENTION

Figure 1:
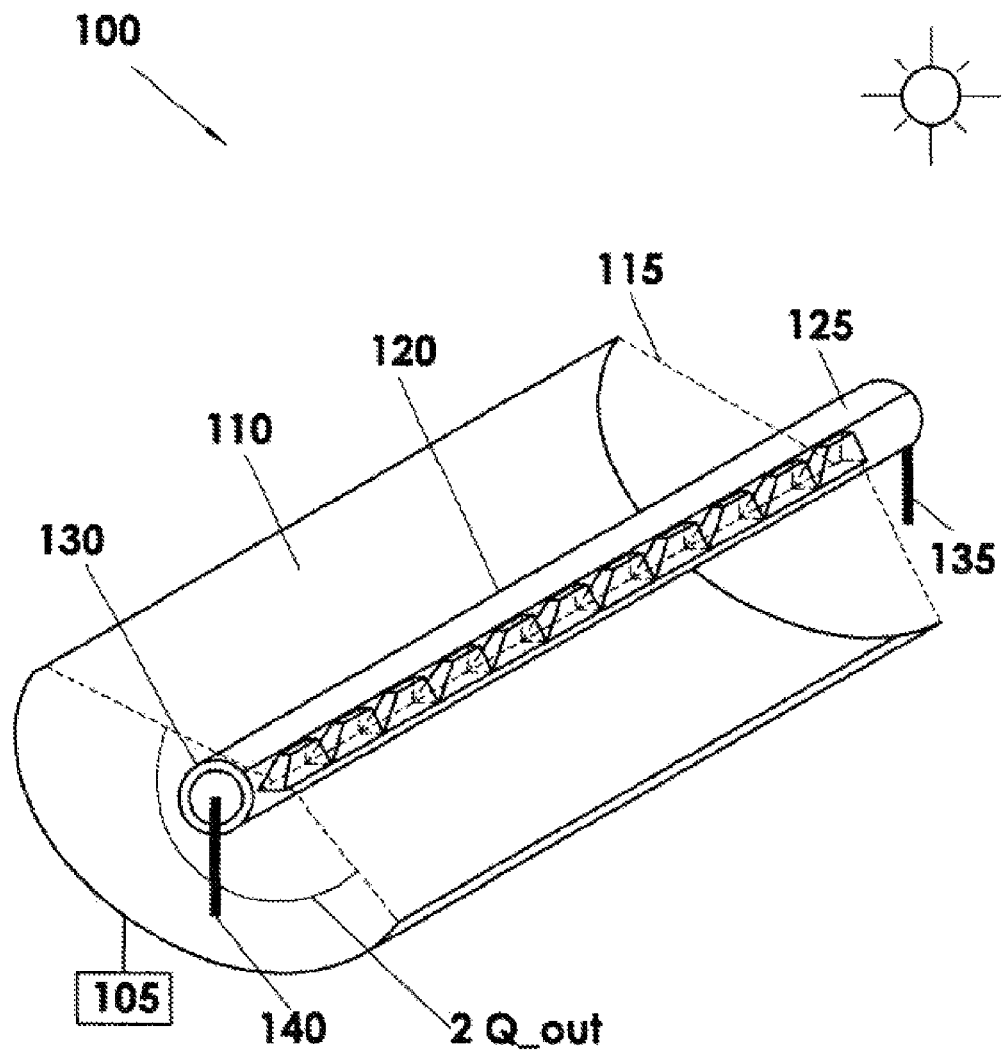
FIG. 1 shows an embodiment of the concentrated photovoltaic and solar heating system the solar generation of electricity and a heated fluid.

FIG. 1 shows an embodiment 100 of the concentrated photovoltaic and solar heating system. The embodiment 100 may comprise a solar tracker 105, a primary sunlight concentrator 110, concentrated sunlight 115, and a solar power generation unit 120.

The solar tracker 105 supports and orients the concentrated photovoltaic and solar heating system 100 towards the sun. The solar tracker 105 may be one-axis azimuth tracking system, a dual-axis azimuth and elevation tracking system, or in some embodiments, the solar tracker 105 may be a stationary system.

The primary sunlight concentrator 110 receives incoming sunlight. In some embodiments, the primary sunlight concentrator 110 may be a parabolic trough. On receiving the sunlight, the primary sunlight concentrator 110 concentrates the sunlight and redirects the concentrated sunlight 115 to the solar power generation unit 120.

The solar power generation unit 120 comprises a transparent tube 125, an electrical power port 130, a fluid inlet 135, a fluid outlet 140 and two solar power generation systems. The transparent tube 125 houses the two solar energy conversion systems while permitting the discharge of electrical energy via the electrical power port 130, and the ingress and egress of a transparent fluid (described in FIG. 2) via the fluid inlet 135, and the fluid outlet 140 respectively.

The transparent tube 125 may be an optical clear glass tube or acrylic tube. An anti-reflection (AR) coating or AR film may be applied to the outer surface of the transparent tube 125 to reduce the reflection loss.

Figure 2:
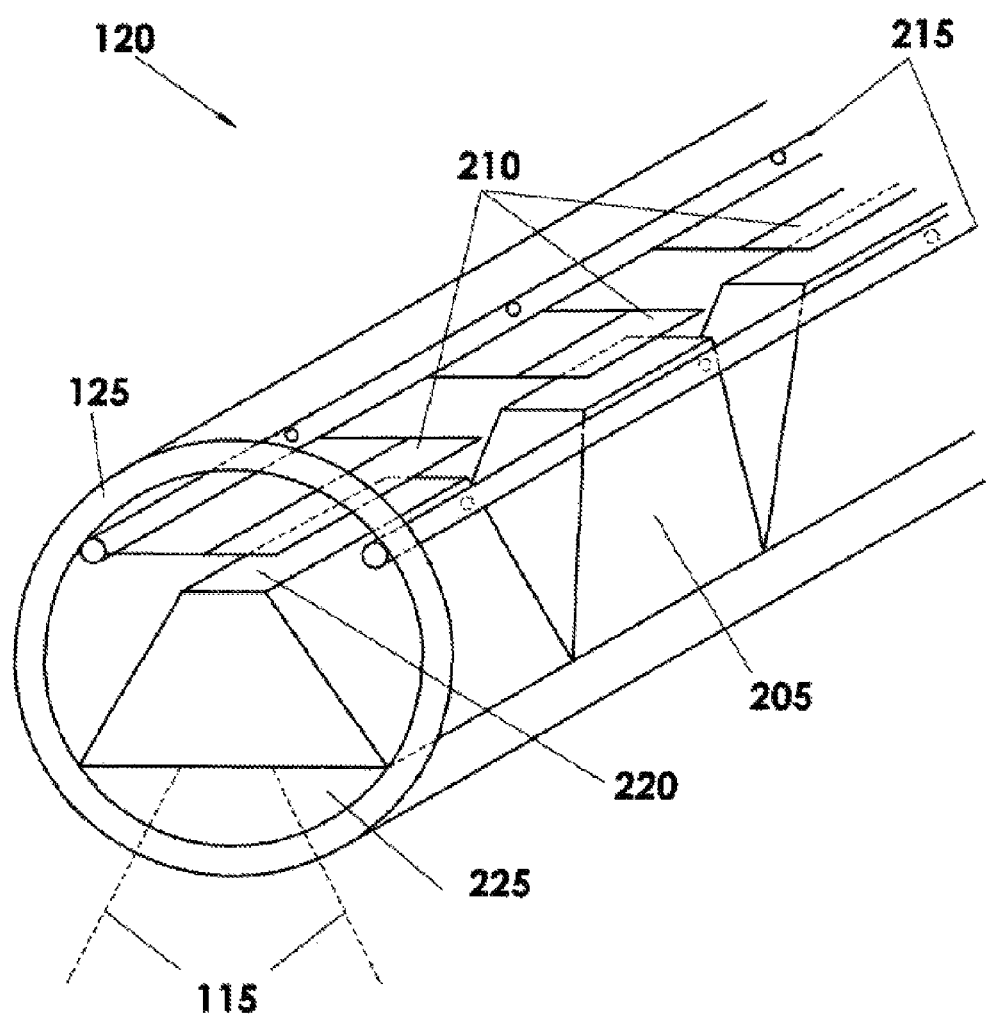
FIG. 2 shows the internal components of the solar power generation unit.

FIG. 2 shows the internal components of the solar power generation unit 120. The solar power generation unit 120 comprises at least one secondary sunlight concentrator 205, a solar cell array 210, a solar cell frame 215, a cooling gap 220 and a transparent fluid 225.

On reaching the solar power generation unit 120, the concentrated sunlight 115 passes through the wall of the transparent tube 125 and into the transparent fluid 225 within the transparent tube 125.

Flowing through the interior space of the transparent tube 125 is the transparent fluid 225, which enters the solar power generation unit 120 via the fluid inlet 135, and exits via the fluid outlet 140. In some embodiments, the transparent fluid 225 is in active motion through the transparent tube 125 due to a pump (not shown). In some embodiments, the transparent fluid 225 is in passive motion, i.e. via convection, through the transparent tube 125.

On passing through the transparent fluid 225, the concentrated sunlight 115 loses some of its heat energy to the transparent fluid 225. The concentrated sunlight 115 then enters the at least one secondary sunlight concentrator 205. The at least one secondary sunlight concentrator 205 further concentrates the solar energy of the concentrated sunlight 115 to 300 to 500 suns. On passing through the at least one secondary sunlight concentrator 205, the concentrated sunlight 115 enters the cooling gap 220, which is filled with the flowing transparent fluid 225. Due to the additional energy concentration of the at least one secondary sunlight concentrator 205, the concentrated sunlight 115 is again hotter than the transparent fluid 225, and transfers this remaining heat to the transparent fluid 225. The concentrated sunlight 115 then enters the solar cell array 210 and is converted to electrical energy by the solar cell array 210, which may be affixed in an optimal location of the transparent tube 125 with respect to the at least one secondary sunlight concentrator 205 by the solar cell frame 215. The transparent fluid 225 removes the heat generated by the concentrated sunlight striking the solar cell array 210 as well as the heat generated by the electrical energy created by the solar cell array 210.

As shown in FIG. 2, the transparent fluid 225 flows below, around and above the at least one secondary sunlight concentrator 205 and is heated by the concentrated sunlight 115 and by the solar cell array 210 before exiting the solar power generation unit 120 via the fluid outlet 140 to a heat exchanger system (not shown). The heat exchanger system uses or removes the heat from the transparent fluid 225 for use in heating or in another application. In some embodiments, a fresh supply of transparent fluid 225 is fed from a source to the solar power generation unit 120 via fluid inlet 135. In some embodiments, the transparent fluid 225 is re-circulated to the solar power generation unit 120 via fluid inlet 135.

An optimal total energy output of the solar power generation unit 120 may be achieved by matching the at least one secondary sunlight concentrator 205 to the transparent fluid 225 and to the solar cell array 210. While multiple factors are considered, there is an interdependence of these factors to reduce sunlight energy losses and yet achieve the best heat energy transfer and optimize electrical output.

Figure 3:
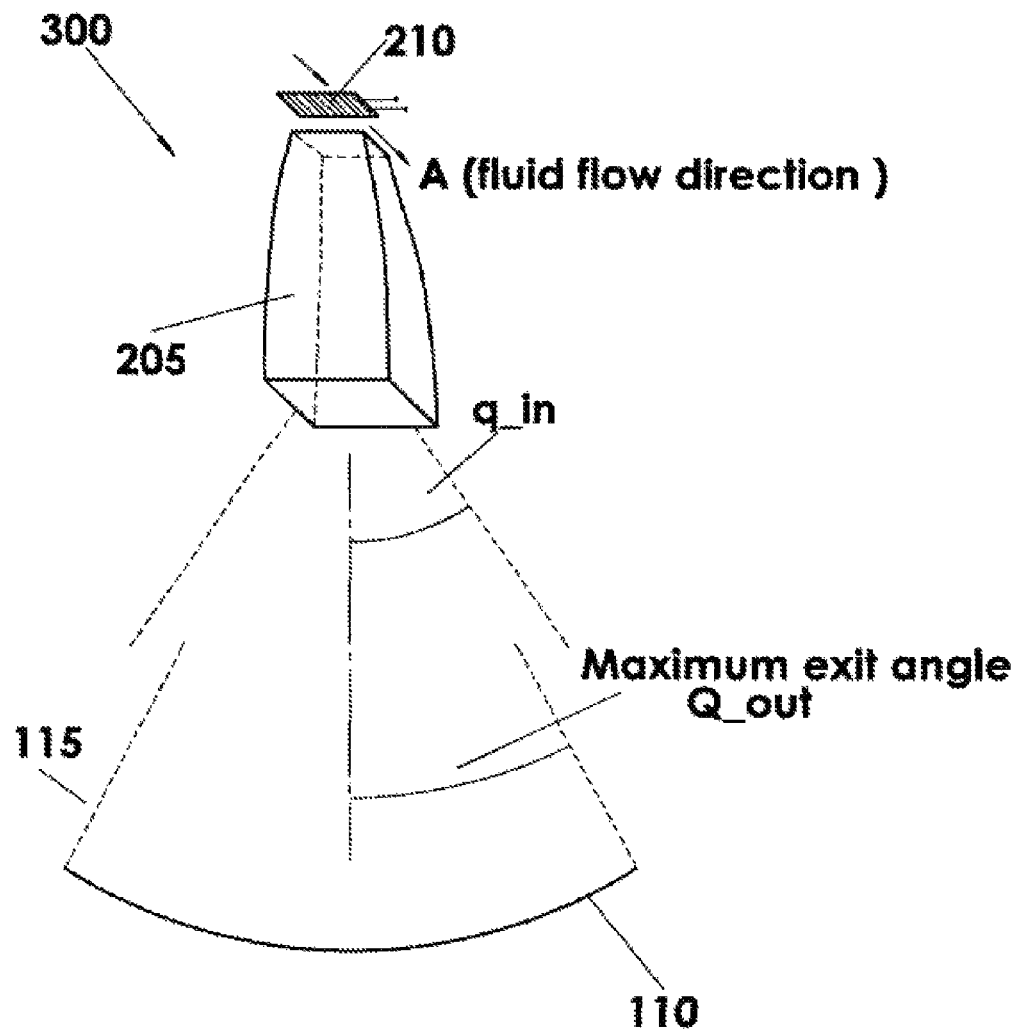
FIG. 3 shows an embodiment of the at least one secondary sunlight concentrator.

FIG. 3 shows an embodiment 300 of the at least one secondary sunlight concentrator 205. One factor of optimal total energy output of the solar power generation unit 120 is that the energy level of the concentrated sunlight 115 is dependent on the configuration of the at least one secondary sunlight concentrator 205. In some embodiments, the at least one secondary sunlight concentrator 205 may be a compound parabolic concentrator (CPC). To achieve optimal energy output in the one-axis tracking system, the collecting angle ($q$ sub in) of the secondary sunlight concentrator along line 'A' should be greater than 23.5 degrees. This is due to the angle of incidence onto the normal of the CPC, which varies between +23.5 degrees at the summer solstice and −23.5 degrees at the winter solstice. The collecting angle perpendicular to line 'A' should be greater than the maximum exit angle of the primary sunlight concentrator 110. To achieve a concentration ratio of 8 to 12, the exit angle ($q$ sub out) of the CPC should be about 60 to 70 degrees. The concentration ratio for the primary sunlight concentrator 110 is about 30 to 60. Together, the pair of the primary sunlight concentrator 110 and the secondary sunlight concentrator 205 as described below will concentrate the energy level of the incoming sunlight to about 500 times that of un-concentrated sunlight.

To further improve electrical output, the secondary sunlight concentrator 205 may be designed to have a total-internal-reflection (TIR) in the transparent fluid 205. This may be achieved by having the secondary sunlight concentrator 205 made hollow with a material having a refraction index smaller than the refraction index of the transparent fluid 225 with the transparent fluid 225 inside the secondary sunlight concentrator 205. For example, the refractive index of transparent Teflon FEP is about 1.34 and the refraction index of Teflon AF 2000 is only about 1.29. Thus, hollow transparent Teflon FEP or Teflon AF 2000 may be used as the secondary sunlight concentrator with mineral oil, which has a refractive index of about 1.46

A total-internal-reflection (TIR) may also be achieved by having the secondary sunlight concentrator 205 made solid with a material having a refraction index greater than the refraction index of the transparent fluid 225. For example, the refractive index of acrylic is about 1.49 and the refractive index of Pyrex glass is about 1.47. Consequently, solid acrylic or Pyrex may be used with water, which has a refractive index of about 1.33.

Teflon products, however, are more expensive than other higher refractive index materials. To lower the cost of the secondary sunlight concentrator 205, transparent Teflon FEP or Teflon AF 2000 may be applied as an internal coating to a hollow secondary sunlight concentrator 205. In such a case, neither the total-internal-reflection (TIR) nor the reflective index of the secondary sunlight concentrator or the transparent fluid needs to be considered.

Another factor is that the amount of heat energy absorbed from the concentrated sunlight 115 and the heat generated by the solar cell array 210 is dependent on the thermal conductivity and heat capacity, i.e. the material composition, of the transparent fluid 225. The thermal conductivity of water is 0.58 W/mK, while the thermal conductivity of mineral oil is 0.138 W/mK, i.e. about ⅕ of that of water. Conversely, the heat capacity of water is 4.19 kJ/kgK, while the heat capacity of mineral oil is 1.67 kJ/kg K.

Another factor is that the electrical output of the solar cell array 210 may be temperature dependent. The temperature of the solar cell array is a function of ambient temperature around it, which in turn depends on the flow rate of the transparent fluid 225, the solar heat of the concentrated sunlight 115 striking the solar cell array 210 and the heat created by the generated electricity. The temperature of the flowing transparent fluid 225 is proportional to the amount of concentrated sunlight 115 passing through the transparent fluid 225 and is inversely proportional to the flow rate of the transparent fluid 225, i.e. the solar heat absorbed by the transparent fluid 225 is transferred to the outside. Thus, the flow rate of the transparent fluid 225 may be raised or lowered to adjust the temperature of the solar cell array 210 for optimum electrical generation.

Figure 4:
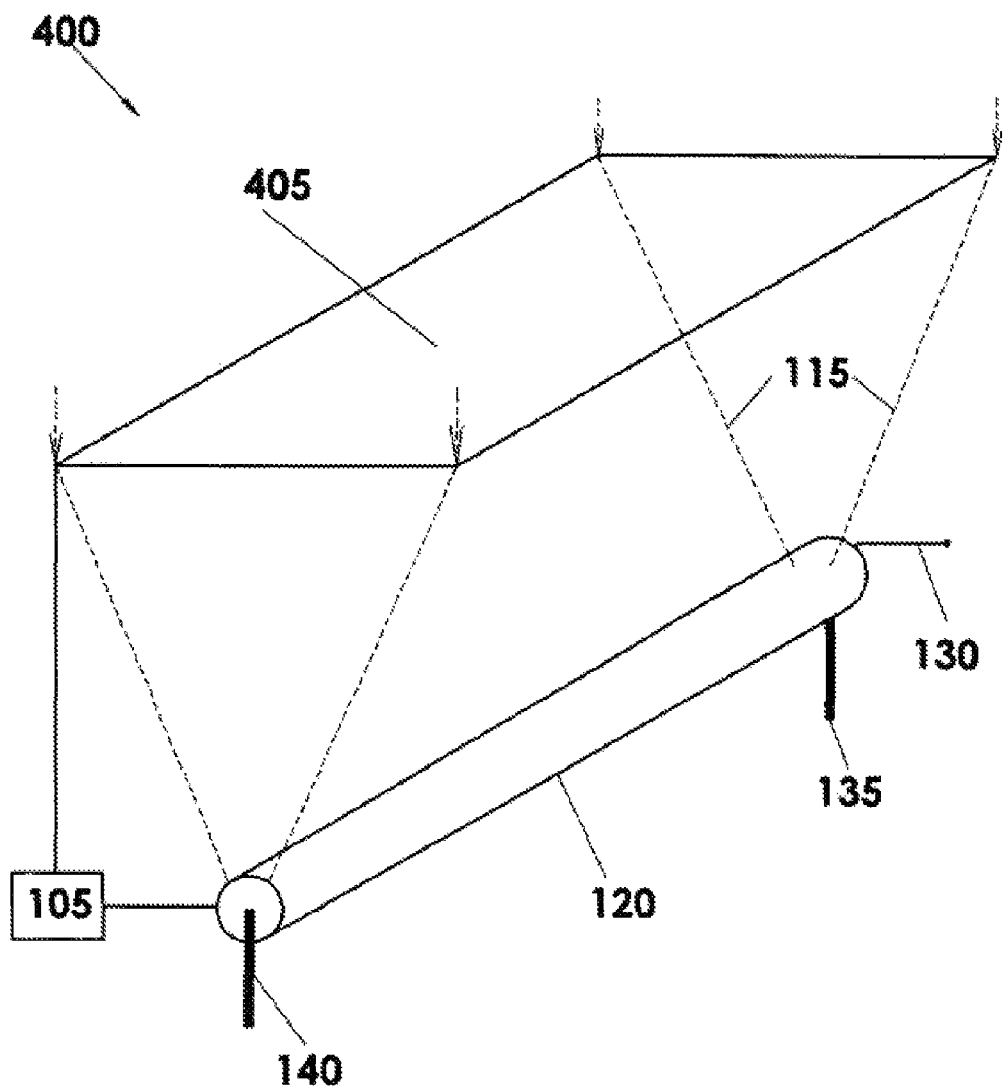
FIG. 4 shows an alternate embodiment of the concentrated photovoltaic and solar heating system for the solar generation of electricity and a heated fluid.

FIG. 4 shows an alternate embodiment 400 of the concentrated photovoltaic and solar heating system. The embodiment 400 may comprise the solar tracker 105, an alternate primary sunlight concentrator 405, the concentrated sunlight 115, and the solar power generation unit 120.

The solar tracker 105 supports and orients the concentrated photovoltaic and solar heating system 400 towards the sun. The solar tracker 105 may be one-axis azimuth tracking system, a dual-axis azimuth and elevation tracking system, or in some embodiments, the solar tracker 105 may be a stationary system.

The concentrated photovoltaic and solar heating system 400 incorporates a linear Fresnel lens as the alternate primary sunlight concentrator 405. In addition, the solar power generation unit 120 is oriented towards the sun, rather than receiving the concentrated sunlight 115 as reflected sunlight.

As shown in FIG. 4, the alternate primary sunlight concentrator 405, i.e. the linear Fresnel lens, is between the sun and the solar power generation unit 120. As such, the solar power generation unit 120 is rotated to receive the concentrated sunlight 115 from the primary sunlight concentrator 405, which is above it in FIG. 4, i.e. as though the sun is overhead. In some embodiments, the solar power generation unit 120 and the alternate primary sunlight concentrator 405 may be rotated towards one side, as for higher latitudes or when the sun is low in the sky. This change in configuration may affect the design and assembly of a frame attachment (not shown) to the solar tracker 105, but the function and operation of the solar tracker 105 and the solar power generation unit 120 are sufficiently the same as to not have distinguishing technical differences.

Figure 5:
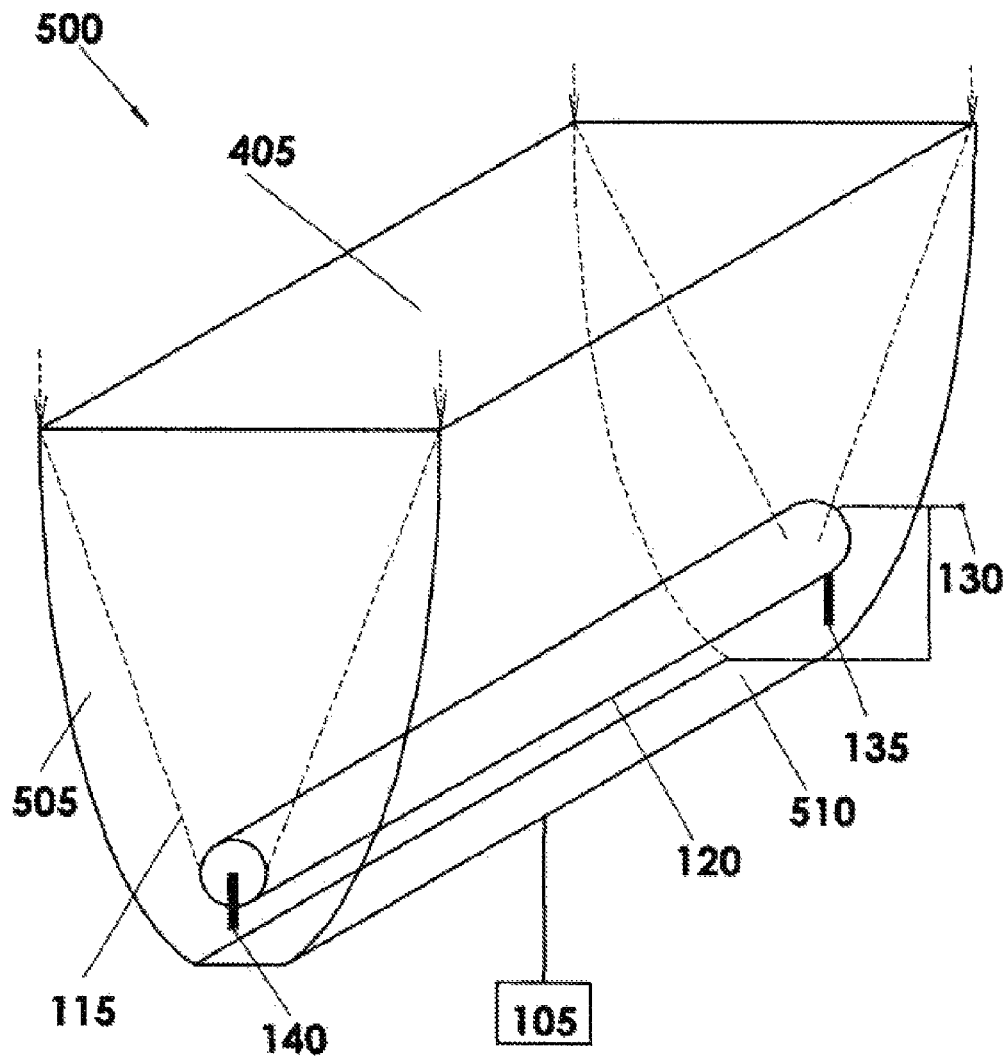
FIG. 5 shows another embodiment of the concentrated photovoltaic and solar heating system.

FIG. 5 shows another embodiment 500 of the concentrated photovoltaic and solar heating system. The embodiment 500 may comprise the solar tracker 105, the alternate primary sunlight concentrator 405, the concentrated sunlight 115, the solar power generation unit 120, a reflective compound parabolic enclosure 505, and a secondary solar cell array 510 inside the reflective compound parabolic enclosure 505 opposite the solar power generation unit 120 from the alternate primary sunlight concentrator 405.

The solar tracker 105 supports and orients the concentrated photovoltaic and solar heating system 500 towards the sun. The solar tracker 105 may be one-axis azimuth tracking system, a dual-axis azimuth and elevation tracking system, or in some embodiments, the solar tracker 105 may be a stationary system.

As with the embodiment 400, sunlight enters the alternate primary sunlight concentrator 405 and is concentrated and directed towards the solar power generation unit 120. On a cloudy day, however, a large portion of the incoming sunlight may be scattered by the clouds, so that the alternate primary sunlight concentrator 405 cannot direct the concentrated sunlight 115 towards the solar power generation unit 120. The reflective compound parabolic enclosure 505 redirects the concentrated sunlight 115 for the generation of electricity by the secondary solar cell array 510. Consequently, with two solar cell arrays, the concentrated photovoltaic and solar heating system 500 still produces electricity even on a cloudy day, as well as transferring its heat to the transparent fluid 225.

Figure 6:
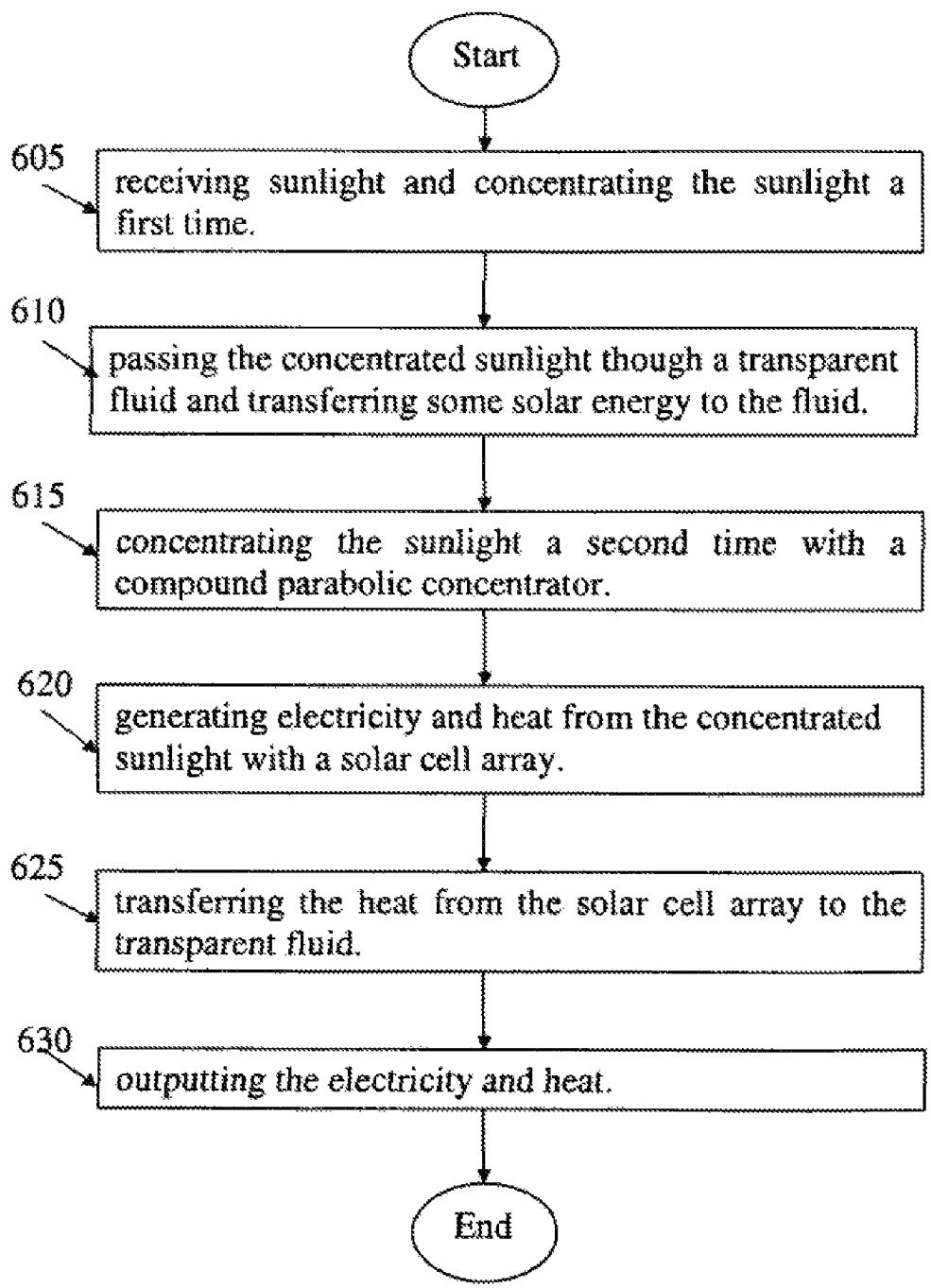
FIG. 6 shows a flowchart of a method for the solar generation of electricity and a heated fluid.

FIG. 6 shows a flowchart of a method for the solar generation of electricity and a heated fluid.

At step 601, sunlight is received and concentrated a first time;

At step 610, the concentrated sunlight is passed though a transparent fluid and transfers solar energy to the transparent fluid;

At step 615, the sunlight is concentrated a second time by passing it through a compound parabolic concentrator;

At step 620, the concentrated sunlight is passed a second time though the transparent fluid and transfers solar energy to the transparent fluid;

At step 625, the concentrated sunlight strikes a solar cell and generates electricity.

The embodiments discussed here are illustrative of the present invention. Elements in the figures are illustrated for simplicity and clarity and are not drawn to scale. Some elements may be exaggerated to improve the understanding of various embodiments. The descriptions and illustrations, as well as the various modifications or adaptations of the methods and/or specific structures described are within the spirit and scope of the present invention. Hence, these descriptions and drawings should not be considered in a limiting sense, as it is understood that the present invention is in no way limited to only the embodiments illustrated.

What is claimed is:

1. A solar power generation system for concurrently generating electricity and heating a transparent fluid with solar radiation comprising:
   a solar tracking system for aligning a primary sunlight concentrator, a fluid heating system and a solar power electrical generation system towards the sun;
   a primary sunlight concentrator comprising a parabolic trough for concentrating sunlight and directing the concentrated sunlight towards the fluid heating system and the solar power electrical generation system;
   a fluid heating system for solar heating of a transparent fluid comprising a fluid transport tube, a compound parabolic concentrator as a secondary sunlight concentrator and a transparent fluid, the transparent fluid heated by passing concentrated sunlight from the primary sunlight concentrator through the transparent fluid, then further concentrating the sunlight through the secondary sunlight concentrator and then passing the further concentrated sunlight though the transparent fluid a second time, and further heating the transparent fluid with heat from a solar cell array; and
   a solar power electrical generating system for generating electricity comprising the compound parabolic concentrator as the secondary sunlight concentrator and the solar cell array receiving the further concentrated sunlight from the compound parabolic concentrator for generating electricity.

2. The solar power generation system for concurrently generating electricity and heating a transparent fluid with solar radiation of claim 1 wherein the secondary sunlight concentrator is hollow and has a refraction index less than a refraction index of the transparent fluid.

3. The solar power generation system for concurrently generating electricity and heating a transparent fluid with solar radiation of claim 1 wherein the secondary sunlight concentrator is hollow and has a highly reflective inner surface.

4. The solar power generation system for concurrently generating electricity and heating a transparent fluid with solar radiation of claim 1 wherein the secondary sunlight concentrator is solid and has a refraction index greater than a refraction index of the transparent fluid.

5. The solar power generation system for concurrently generating electricity and heating a transparent fluid with solar radiation of claim 1 wherein the transparent fluid is mineral oil.

6. The solar power generation system for concurrently generating electricity and heating a transparent fluid with solar radiation of claim 1 wherein the transparent fluid is water.

7. The solar power generation system for concurrently generating electricity and heating a transparent fluid with solar radiation of claim 1 further comprising adjusting the flow rate of the transparent fluid to maintain the temperature of the solar cell array at an optimum temperature for generating electricity.

8. The solar power generation system for concurrently generating electricity and heating a transparent fluid with solar radiation of claim 1 wherein the solar tracking system is a one-axis azimuth tracking system.

9. The solar power generation system for concurrently generating electricity and heating a transparent fluid with solar radiation of claim 1 wherein the solar tracking system is a two-axis azimuth and elevation tracking system.

10. The solar power generation system for concurrently generating electricity and heating a transparent fluid with solar radiation of claim 1 wherein the transparent fluid is convection driven through the solar power generation system.

11. The solar power generation system for concurrently generating electricity and heating a transparent fluid with solar radiation of claim 1 wherein the concentrated sunlight is heat diminished by cooling with the transparent fluid.

\* \* \* \* \*